US 6,502,628 B1

(12) United States Patent
Siahpolo et al.

(10) Patent No.: US 6,502,628 B1
(45) Date of Patent: Jan. 7, 2003

(54) METHOD AND APPARATUS FOR UNDIRECTIONAL COOLANT FLOW CONTROL UNIT FOR PRESSURIZED COOLING SYSTEMS

(75) Inventors: Hassan Siahpolo, Campbell, CA (US); Mark Chen, Palo Alto, CA (US); Eric Eberhardt, San Francisco, CA (US); Ehsan Ettehadieh, Berkeley, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/639,959

(22) Filed: Aug. 16, 2000

(51) Int. Cl.$^7$ ................................................ F28F 13/12
(52) U.S. Cl. ........................ 165/122; 454/184; 361/695
(58) Field of Search .......................... 165/80.3, 104.33, 165/121, 122, 104.34; 361/678, 687, 688, 690, 695, 696, 697; 454/184

(56) References Cited

U.S. PATENT DOCUMENTS

| 4,887,522 A | * | 12/1989 | Kuno et al. .................. 454/184 |
| 5,412,534 A | * | 5/1995 | Cutts et al. .................. 361/695 |
| 5,773,755 A | * | 6/1998 | Iwatare ....................... 361/695 |
| 6,005,770 A | * | 12/1999 | Schmitt ....................... 454/184 |
| 6,021,042 A | * | 2/2000 | Anderson et al. ............ 361/695 |
| 6,031,717 A | * | 2/2000 | Baddour et al. ............. 361/687 |
| 6,042,348 A | * | 3/2000 | Aakalu et al. ............... 361/695 |
| 6,108,203 A | * | 8/2000 | Dittus et al. ................ 165/80.3 |
| 6,115,250 A | * | 9/2000 | Schmitt ................... 165/104.34 |
| 6,135,875 A | * | 10/2000 | French ........................ 454/184 |
| 6,151,211 A | * | 11/2000 | Dayan et al. ................ 361/690 |
| 6,155,920 A | * | 12/2000 | Pan et al. .................... 361/695 |
| 6,181,557 B1 | * | 1/2001 | Gatti .......................... 454/184 |

* cited by examiner

Primary Examiner—Denise L. Esquivel
Assistant Examiner—Terrell McKinnon
(74) Attorney, Agent, or Firm—O'Melveny & Myers LLP

(57) ABSTRACT

The present invention is a method and apparatus for unidirectional coolant flow control unit for pressurized cooling systems. The invention comprises a valve on a coolant flow control unit. The valve remains in the open position during normal function of the coolant flow control unit. If the coolant flow control unit fails, the valve closes. Thus, the cooling system performs better than prior art cooling systems in the event of a failure of one or more coolant flow control units. In one embodiment, multiple improved coolant flow control units can be implemented wherein a flow of coolant enters one side of the system and exits the other side. In the even of a failure, the closure of the valve is caused by the shifting pressure within the system, which forestalls the cooling problems associated with prior art redundant coolant control flow systems.

14 Claims, 5 Drawing Sheets

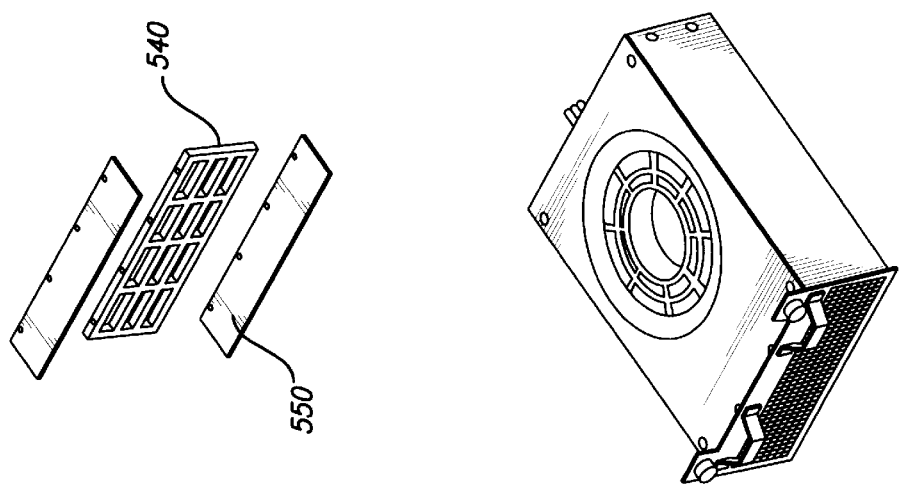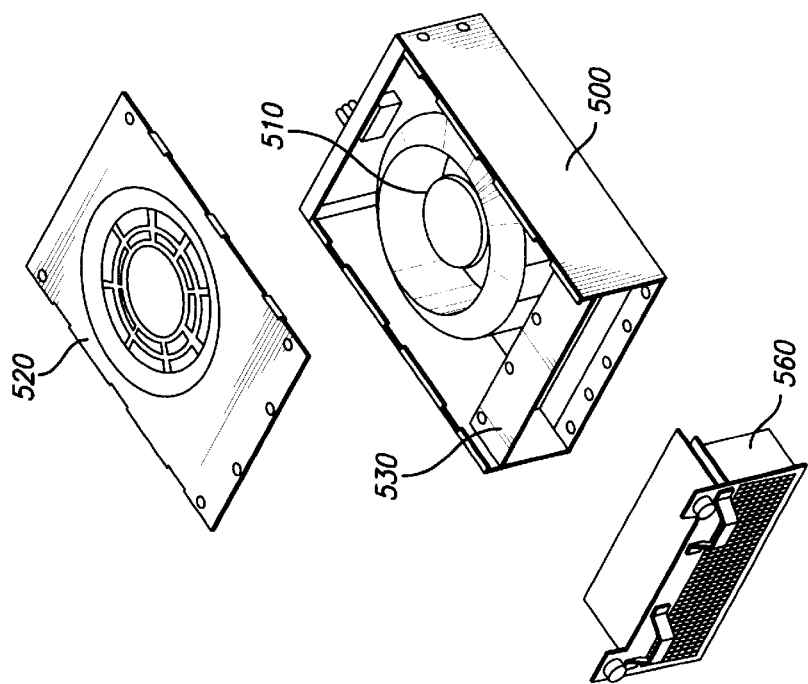
FIG. 5

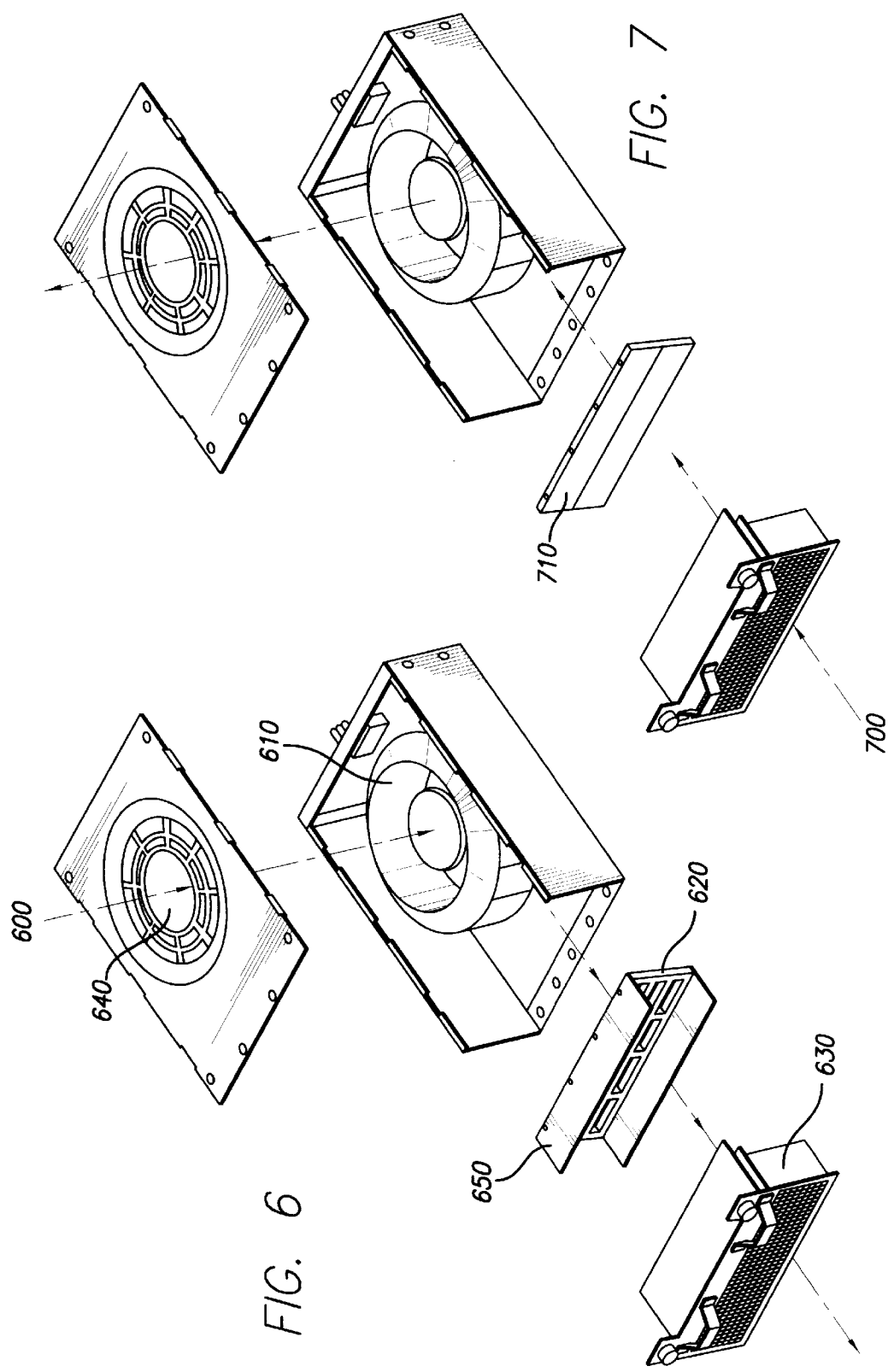

METHOD AND APPARATUS FOR UNDIRECTIONAL COOLANT FLOW CONTROL UNIT FOR PRESSURIZED COOLING SYSTEMS

BACKGROUND OF THE INVENTION

1. Field of the Invention

The present invention relates to cooling systems, and in particular to arrangements of unidirectional coolant flow control units for pressurized cooling systems.

2. Background Art

Many systems require cooling to function properly. Some systems accomplish cooling through the flow of a coolant through the system. A cooling system can use redundant coolant flow control units to achieve greater reliability. However, in some systems, if one coolant flow control unit fails, the flow of coolant through that control unit can reverse itself, causing the cooling system to fail and the entire system to overheat. This problem can be better understood by a review of cooling systems.

Cooling Systems

Many systems (e.g. general purpose computers, automobiles and nuclear reactors) use a coolant to cool the system. Coolants can be any of a variety of substances, including light water, heavy water, air, carbon dioxide, helium, liquid sodium, liquid sodium-potassium alloy, and hydrocarbons (oils). Such substances are good conductors of heat and serve to carry the thermal energy produced by the system away from the system. A system draws fresh coolant in through one or more coolant intakes. The coolant, then, passes over system components which require cooling. Heat transfers from the system components to the coolant, thus cooling the components. Then, the heated coolant is expelled through one or more coolant exhausts.

Negatively Pressurized Systems

The flow of coolant is often driven by a pressure difference between the interior and exterior of the system. The pressure difference is created by a coolant flow control unit. In a negatively pressurized system, a coolant flow control unit forces coolant out through a coolant exhaust. The smaller amount of coolant in the system causes the pressure inside the system to drop. Thus, the pressure inside the system will drop below the pressure outside the system near one or more coolant intakes. The pressure difference forces fresh coolant into the system through one or more coolant intakes. The coolant intakes and exhausts are positioned so that coolant flows through the parts of the system which require cooling. Heat transfers from the system parts to the coolant, and the coolant carries the heat out of the system.

FIG. 1 illustrates a system which cools through a negatively pressurized cooling system. The coolant flow control unit (100) causes the pressure on the inside of the system (110) near the coolant exhaust (120) to be higher than the pressure on the outside of the system (130). As a result, heated coolant (140) is expelled from the system through the coolant exhaust. The decrease in the amount of coolant in the system causes the pressure inside the system near the coolant intake (150) to be lower than the pressure outside the system. Thus, fresh coolant (160) flows into the system through the coolant intake. The fresh coolant will flow from the coolant intake, over the vital system components (170) and to the coolant exhaust.

Redundant Coolant Flow Control Units

FIG. 2 illustrates a cooling system with redundant coolant flow control units. Coolant flow control units 1 (200) and 2 (210) cause the pressure on the inside of the system (220) near coolant exhausts 1 (230) and 2 (240), respectively, to be higher than the pressure on the outside of the system (250). As a result, heated coolant (260) is expelled from the system through coolant exhausts 1 and 2. The decrease in the amount of coolant in the system causes the pressure inside the system near the coolant intake (270) to be lower than the pressure outside the system. Thus, fresh coolant (280) flows into the system through the coolant intake. The fresh coolant will flow from the coolant intake, over the vital system components (290) and to the coolant exhaust.

Redundant coolant flow control units are used to improve system reliability in some applications where cooling is critical. If a coolant flow control unit fails in a negatively pressured cooling system with redundant coolant flow control units, the pressure inside the system near the coolant exhaust for that failed coolant is no longer higher than the pressure outside the system. Since other coolant flow control units continue to force coolant out of the system, the pressure inside the system near the exhaust for the failed coolant flow control unit is lower than pressure outside the system. Thus, the flow of coolant through the failed coolant flow control unit reverses.

The flow reversal allows coolant to enter the system through the coolant exhaust for the failed coolant flow control unit and leave the system through a coolant exhaust for a functioning coolant flow control unit without passing over any of the system components which require cooling. The coolant entering the system through the coolant exhaust for the failed coolant flow control unit increases the pressure inside the system. The pressure increase brings the pressure inside the system closer to being equal to the pressure outside the system. As a result, less coolant is drawn in through the coolant intakes. Less coolant flowing through coolant intakes causes less coolant to flow over system components which can results in the system components being insufficiently cooled. Thus, a failed coolant flow control unit may result in parts of the system being insufficiently cooled.

FIG. 3 illustrates a system with redundant coolant flow control units, in which coolant flow control unit 1 (300) has failed. Coolant flow control unit 2 (310) still forces heated coolant (320) out of the system through coolant exhaust 2 (330). As a result, the pressure inside the system (340) near coolant exhaust 1 (350) is lower than outside the system (360). Thus, fresh coolant (370) flows in through coolant exhaust 1. That fresh coolant can flow out through coolant exhaust 2 without flowing over the vital system components (380). Additionally, since the pressure inside the system is equalized by the flow of coolant through coolant exhaust 1, the pressure near the coolant intake (390) is close to equivalent inside and outside the system. Thus, the amount of fresh coolant flowing in through the coolant intake and over the vital system components is greatly reduced. This may result in the vital system components overheating and the system failing in applications that utilize redundant coolant flow control units.

SUMMARY OF THE INVENTION

The present invention is a method and apparatus for unidirectional coolant flow control unit for pressurized cooling systems. Pressurized cooling systems with multiple coolant flow control units encounter problems when one or more coolant flow control units fails. If one or more coolant flow control units fails, the flow of coolant through the failed coolant flow control unit reverses. Reversal of coolant flow through a failed coolant flow control unit results in reduced performance of the cooling system and/or an overheating of the system due to a lack of cooling over the vital components of the system.

The invention comprises a valve on a coolant flow control unit. The valve remains in the open position during normal function of the coolant flow control unit. However, if the coolant flow control unit fails resulting in a reversal of the flow, the valve closes. Thus, the cooling system performs better than prior art cooling systems in the event of a failure of one or more coolant flow control units.

In one embodiment, multiple improved coolant flow control units can be implemented wherein a flow of coolant enters one side of the system and exits the other side. In the even of a failure, the closure of the valve is caused by the shifting pressure within the system, which forestalls the cooling problems associated with prior art redundant coolant control flow systems. One embodiment of the present invention can be implemented in computer systems. Other embodiments of the present invention are used in other systems where a pressurized cooling system is required.

BRIEF DESCRIPTION OF THE DRAWINGS

These and other features, aspects and advantages of the present invention will become better understood with regard to the following description, appended claims and accompanying drawings where:

FIG. 5 is a block diagram of one embodiment of the present invention.

FIG. 6 is a block diagram of the operation of one embodiment of the present invention.

FIG. 7 is a block diagram of the operation of one embodiment of the present invention in which the flippers closed.

DETAILED DESCRIPTION OF THE INVENTION

Figure 1:
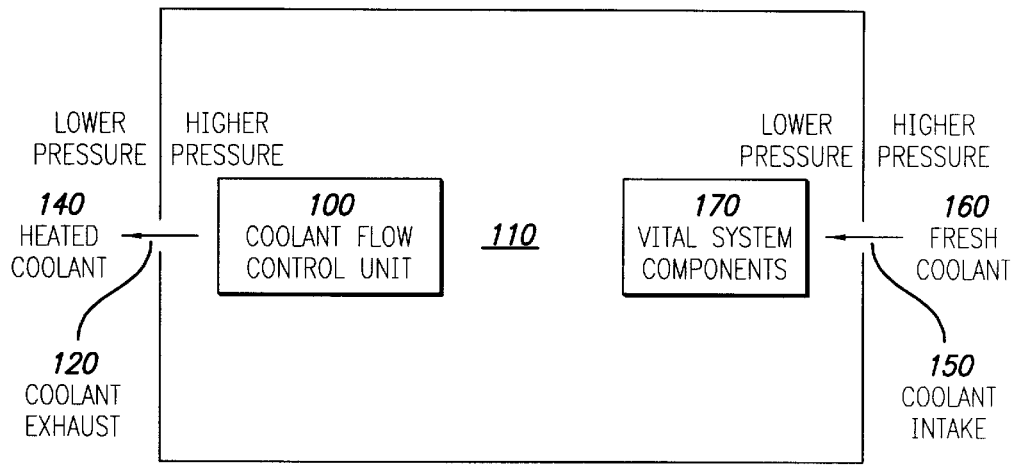
FIG. 1 is a block diagram of a negatively pressured cooling system.
Figure 2:
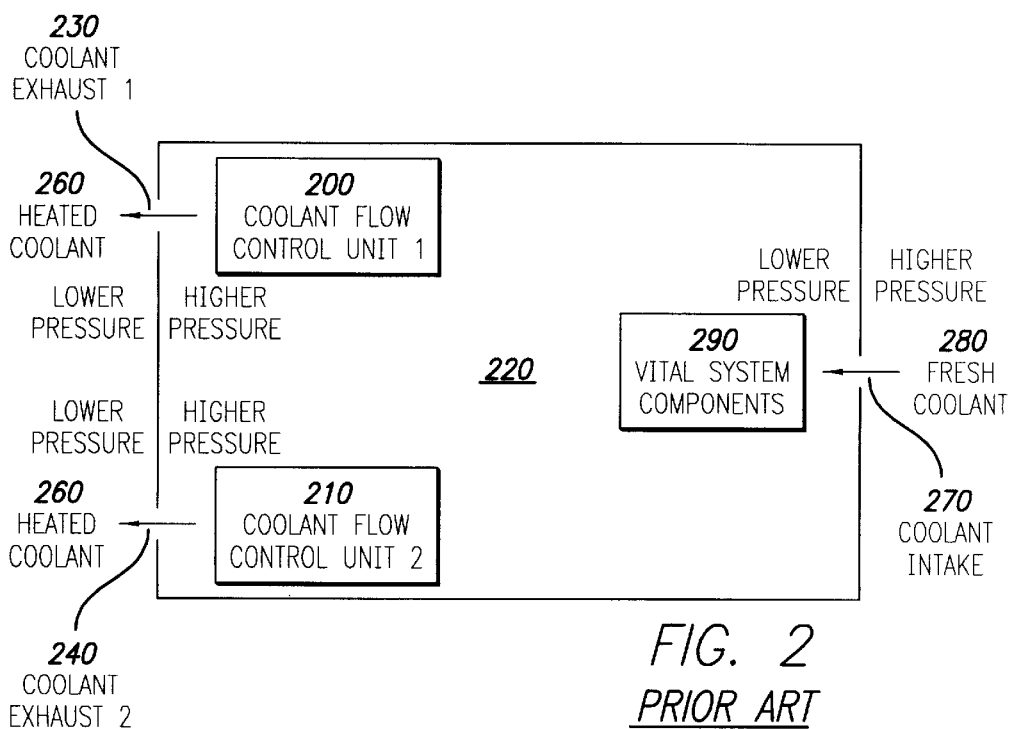
FIG. 2 is a block diagram of a cooling system with two coolant flow control units.
Figure 3:
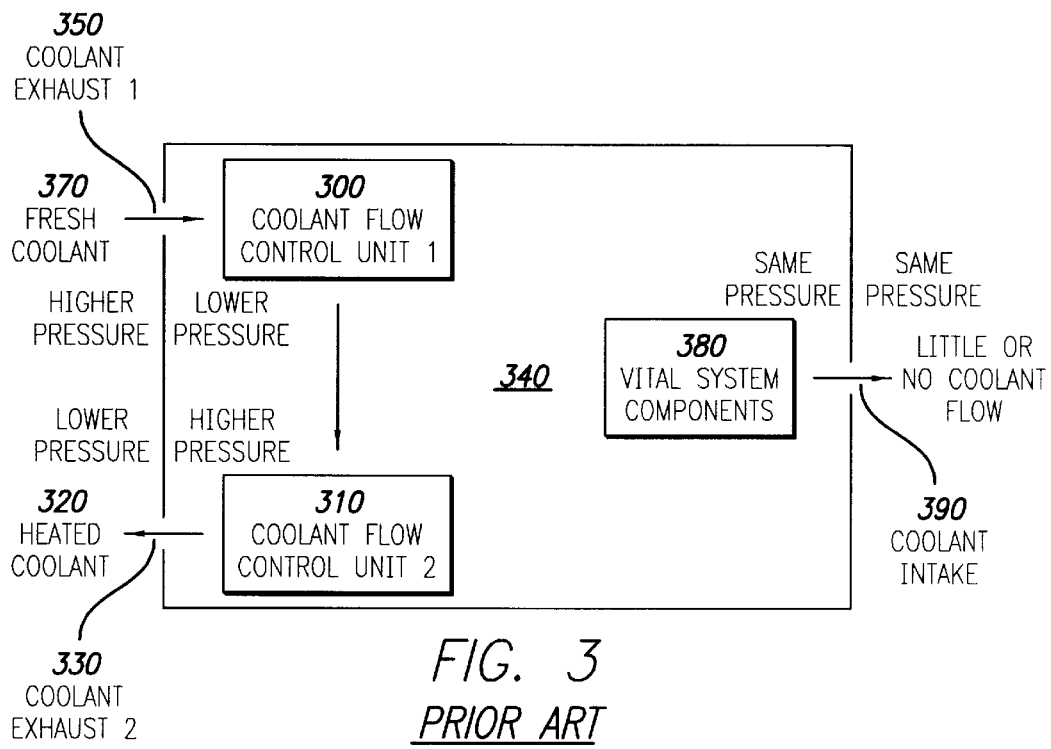
FIG. 3 is a block diagram of a cooling system with two coolant flow control units, one of which has failed.

The invention is a method and apparatus for unidirectional coolant flow control unit for pressurized cooling systems. In the following description, numerous specific details are set forth to provide a more thorough description of embodiments of the invention. It will be apparent, however, to one skilled in the art, that the invention may be practiced without these specific details. In other instances, well known features have not been described in detail so as not to obscure the invention.

Multiple Coolant Flow Control Units

Pressurized cooling systems with multiple coolant flow control units encounter problems when one or more coolant flow control units fail. If a coolant flow control unit fails, the flow of coolant through the failed coolant flow control unit could reverse. In a negatively pressurized cooling system, reversal of coolant flow through a failed coolant flow control unit allows coolant to flow directly from the coolant exhaust of the failed coolant flow control unit to a functioning coolant flow control unit. Coolant flowing into the cooling system through the coolant exhaust near the failed coolant flow control unit compensates for the low pressure inside the system created by the functioning coolant flow control units. Thus, little or no coolant enters the system through the coolant intake.

Cooling systems are designed so that coolant flowing from the coolant intake to the coolant exhausts will flow over components which require cooling. The coolant flowing from a failed coolant flow control unit to a functioning coolant flow control unit need not flow over any system component which requires cooling. Additionally, very little coolant flows from the coolant intakes to the coolant exhausts when one or more coolant flow control units fail. As a result, reduced amounts of coolant flow over components of the system which require cooling. Thus, performance of the cooling system is reduced when one or more coolant flow control units fails and/or the system completely overheats.

Unidirectional Coolant Flow Control Units

The invention comprises a one-way valve on a coolant flow control unit. The valve remains in the open position during normal function of the coolant flow control unit. However, if the coolant flow control unit fails resulting in a reversal of the flow, the valve closes, stopping the flow. As a result, coolant flow through the flow control unit cannot reverse. Thus, if there is any flow of coolant, the coolant can only flow in one direction.

In a negatively pressured system using one embodiment of the present invention, once the coolant flow control unit fails, the one-way valve closes and prevents any coolant from entering the system through the failed unit. Thus, a coolant flow into the system through the failed coolant flow control unit cannot compensate for the low pressure inside the system caused by functioning coolant flow control units. As a result, coolant is drawn in through the coolant intake to compensate for lower pressure inside the system. The coolant drawn in through the coolant intake flows over the system components in need of cooling and out through the coolant exhaust for a functioning coolant flow control unit. Thus, the cooling system performs better than prior art cooling systems in the event of a failure of one or more coolant flow control units.

Figure 4:
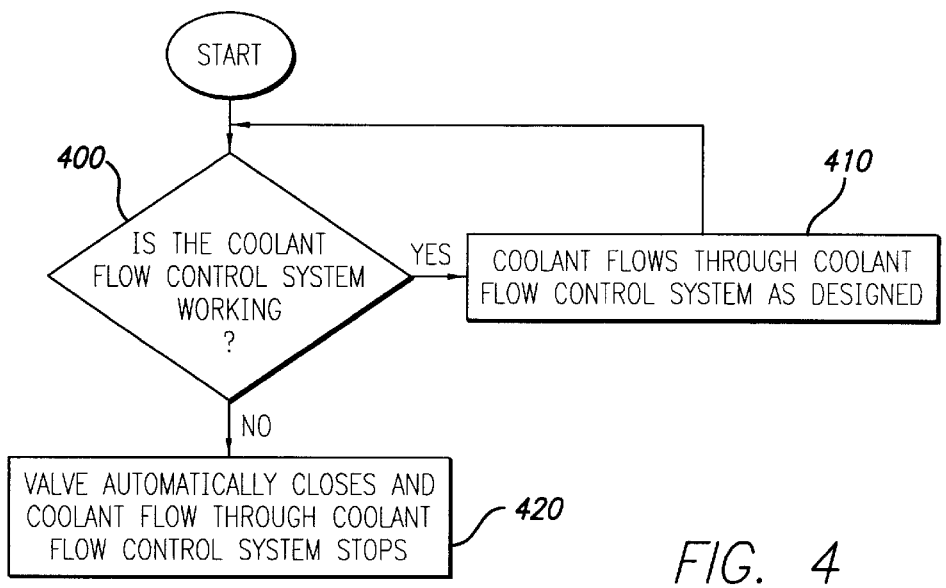
FIG. 4 is a flow diagram of the operation of one embodiment of the present invention.

FIG. 4 illustrates the behavior of one embodiment of the present invention. At step 400, it is decided whether the coolant flow control unit is functioning. If the coolant flow control unit is functioning properly, at step 410, coolant flows through the coolant flow control unit in accordance with the design of the unit and the process returns to step 400. If the coolant flow control unit fails, at step 420, the valve on the coolant flow control unit automatically closes, thus preventing the flow through the unit from reversing. As a result, flow through the coolant flow control unit stops.

Unidirectional Airflow Control Unit

FIG. 5 illustrates one embodiment of the invention. The coolant is air and the coolant flow control unit is a blower, however, one skilled in the art will notice that any coolant and any coolant control flow unit can be used with the present invention. The embodiment of FIG. 5 is for use in a cooling system for a computer system and is comprised of a chassis (500) containing a fan (510), a cover with an air vent (520), a valve assembly (530) comprised of an airflow plastic panel (540) with two attached flippers (550) fitted into the blower exhaust path and a front cover with a printed circuit board (PCB) (560).

FIG. 6 illustrates the operation of the embodiment of FIG. 5 when the blower functions properly. Air (600) is forced out by the fan (610) through the plastic screen (620) and front cover (630) and drawn in through the air vent (640). The airflow forces the flippers (650) on the plastic screen completely open. In one embodiment of the present invention, the flippers are mounted to the plastic screen so that the natural resting position of the flippers is a ninety percent (90%) open position. Thus, the flippers cause a low impedance on the airflow. The plastic screen has large openings and thin struts supporting the frame. Thus the plastic screen also causes a low impedance on the airflow.

FIG. 7 illustrates the operation of the embodiment of FIG. 5 when the blower fails. If the blower fails, the negatively pressured system reverses the flow of air (700) through the failed blower. The reversed airflow pulls the lightweight, flexible flippers (710) closed. Since the flippers overlap in the closed position, the blower is sealed, and airflow through the blower stops. Thus, airflow will not bypass electronic components and the system will not overheat.

Figure 8:
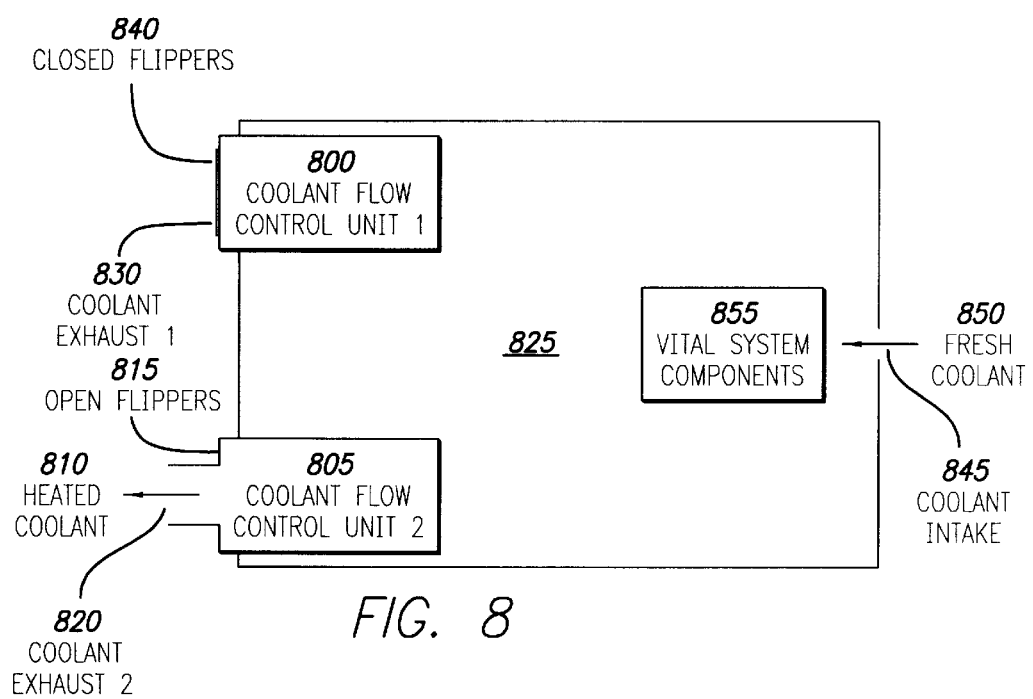
FIG. 8 is a block diagram of a cooling system with two coolant flow control units in accordance with the present invention, one of which has failed.

FIG. 8 illustrates a system with redundant coolant flow control units in accordance with the present invention, in which coolant flow control unit 1 (800) has failed. Coolant flow control unit 2 (805) still forces heated coolant (810) out of the system through the open flippers (815) of coolant exhaust 2 (820). As a result, the pressure inside the system (825) near coolant exhaust 1 (830) is lower than outside the system (835). Thus, the coolant flow begins to reverse through coolant exhaust 1. The coolant flow reversal causes the flippers (840) to close. Thus, the flow into the system through coolant exhaust 1 is stopped. Since the pressure inside the system is not equalized by a flow of coolant through coolant exhaust 1, the pressure inside the system near the coolant intake (845) is lower than pressure outside the system. Fresh coolant (850) flows in through the coolant intake and over the vital system components (855). Thus, the vital system components are cooled in the event one coolant flow control system fails.

Thus, a method and apparatus for a unidirectional coolant flow control unit for pressurized cooling systems is described in conjunction with one or more specific embodiments. The invention is defined by the following claims and their fail scope an equivalents.

What is claimed is:

1. A computer system, comprising:
   an enclosure having at least one intake and at least two exhausts formed therein;
   at least one computer system device disposed in the enclosure; and
   a cooling system including at least two coolant flow control assemblies, each flow control assembly positioned substantially adjacent to one of the at least two exhausts of the enclosure, and each coolant flow control assembly including:
   a pressure creator; and
   a valve assembly substantially aligned with the pressure creator, the valve assembly comprising first and second ends and first and second hinged members, each member having a first side, the first and second hinged members being operatively coupled to the first and second ends of the valve assembly at the first side of each member;
   wherein, each pressure creator is configured to create a pressure difference between a coolant pressure outside the enclosure and a coolant pressure inside the enclosure, the pressure difference causing an inward flow of cool coolant from outside the enclosure through the intake to the at least one computer system device and causing heated coolant exposed to the at least one computer system device to flow outside the enclosure through the at least two exhausts, wherein the members of the valve assembly close if one of the pressure creators of the at least two flow control assemblies fails to maintain the pressure difference, the closed members preventing an inward flow of heated coolant from outside the enclosure adjacent to the exhaust that is substantially adjacent to the failed pressure creator of the at least two coolant flow control assemblies.

2. The computer system of claim 1, wherein each coolant flow control assembly further comprises a chassis having first and second surfaces and the first and second ends of the valve assembly are mounted to the first and second surfaces of the chassis.

3. The computer system of claim 2, wherein the valve assembly further comprises a screen having first and second ends and having apertures formed therein, the first and second ends of the valve assembly comprising the first and second ends of the screen.

4. A cooling system for cooling at least one device with a coolant, the cooling system and the at least one device both positioned within an enclosure, the cooling system comprising:
   at least two coolant flow control assemblies, each flow control assembly including:
   a pressure creator; and
   a valve assembly substantially aligned with the pressure creator, the valve assembly comprising first and second ends and first and second hinged members, each member having a first side, the first and second hinged members being operatively coupled to the first and second ends of the valve assembly at the first side of each member;
   wherein, each pressure creator provides a pressure difference between a coolant pressure outside the enclosure and a coolant pressure inside the enclosure, the pressure difference causing an inward flow of cool coolant from outside the enclosure to the at least one device and causing heated coolant exposed to the at least one device to flow outside the enclosure at at least two locations, each location being substantially adjacent to each pressure creator, wherein the members of the valve assembly move from an open position to a closed position if one of the pressure creators of the at least two flow control assemblies fails to maintain the pressure difference, the closed members thereby preventing an inward flow of heated coolant from outside the enclosure at one of the at least two locations substantially adjacent to the failed pressure creator.

5. The cooling system of claim 4, wherein the enclosure of the cooling system further comprises at least one coolant intake and at least two coolant exhausts, each exhaust substantially aligned with each pressure creator of the at least two flow control assemblies, and wherein the coolant flows along a path comprising the at least one coolant intake, the at least one device, and the at least two coolant exhausts, and wherein the coolant flows along a modified path if one of the at least two pressure creators fails, wherein the modified path comprises the at least one coolant intake, the at least one device, and the remaining one of the at least two coolant exhausts corresponding to the remaining one of the at least two functioning pressure creators.

6. The cooling system of claim 4, wherein the at least one device further comprises a component of a computer system and the cooling system is configured to cool devices of the computer system.

7. The cooling system of claim 4, wherein the at least two coolant flow control assemblies further comprise a chassis having first and second surfaces, each pressure creator of the at least two control assemblies is positioned within the corresponding chassis, and the first and second ends of the valve assembly are mounted to the first and second surfaces of the chassis, the first and second members being directly coupled to the first and second ends of each valve assembly.

8. The cooling system of claim 4, wherein each valve assembly includes a screen with apertures formed therein, the screen having first and second ends and the first and second ends of the screen comprising the first and second ends of the valve assembly.

9. The cooling system of claim 8, wherein the first and second members are mounted to the screen so that the first and second members are substantially open while in a resting position.

10. The cooling system of claim 4, wherein the members are comprised of plastic.

11. The cooling system of claim 4, wherein each of the pressure creators further comprises a fan.

12. The cooling system of claim 4 further comprising coolant, wherein the coolant further comprises air.

13. The cooling system of claim 4, wherein the first and second members overlap one another while in a closed position.

14. A method for cooling devices positioned within an enclosure, the method comprising steps of:

creating a pressure difference between an area within the enclosure and an area outside of the enclosure, the pressure difference causing an inward flow of cool coolant from outside of the enclosure to the devices and an outward flow of heated coolant from inside the enclosure to outside the enclosure at at least two locations; and hinging members of a vent assembly to a closed position to maintain the pressure difference when an insufficient pressure difference at one of the at least two locations prevents the outward flow of heated coolant from inside the enclosure, wherein the members hinge about a side of the member and the closed hinging members prevent an inward flow of heated coolant from outside of the enclosure at the one of the at least two locations.

\* \* \* \* \*